United States Patent [19]

Gupta et al.

[11] Patent Number: 4,929,537

[45] Date of Patent: May 29, 1990

[54] PHOTORESIST COMPOSITIONS BASED ON HYDROXYSTYRENE COPOLYMERS

[75] Inventors: Balaram Gupta, North Plainfield; Palaiyur S. Kalyanaraman, Fanwood, both of N.J.

[73] Assignee: Hoechst Celanese Corp., Somerville, N.J.

[21] Appl. No.: 385,747

[22] Filed: Jul. 27, 1989

Related U.S. Application Data

[62] Division of Ser. No. 148,261, Jan. 25, 1988, Pat. No. 4,869,994.

[51] Int. Cl.$^5$ .......................... G03C 5/16; G03C 1/68
[52] U.S. Cl. ......................................... 430/325; 430/197; 430/286; 430/287; 430/302; 430/330; 430/311; 430/322
[58] Field of Search ............... 430/197, 286, 287, 325, 430/330, 302, 311, 322

[56] References Cited

U.S. PATENT DOCUMENTS

| | | | |
|---|---|---|---|
| 4,689,371 | 8/1987 | Elmore et al. | 525/374 |
| 4,740,451 | 4/1988 | Kohara | 430/197 |
| 4,775,730 | 10/1988 | Gupta | 430/287 |
| 4,824,758 | 4/1989 | Gupta et al. | 430/197 |
| 4,857,601 | 8/1989 | Gupta | 525/344 |
| 4,869,994 | 9/1989 | Gupta et al. | 430/197 |

*Primary Examiner*—Paul R. Michl
*Assistant Examiner*—Thorl Chea
*Attorney, Agent, or Firm*—Lynch, Cox, Gilman & Mahan

[57] ABSTRACT

Negative photoresist compositions are made from copolymers of 4-hydroxystyrene and dialkyl muconates, alkyl sorbates, alkadiene monomers or allyl esters of ethylenically unsaturated acids plus a photosensitizer. Such compositions are useful in photolithographic and photomasking operations in fabricating microelectronic devices, printed circuits, semiconductors, printing plates, dies and the like.

13 Claims, No Drawings

PHOTORESIST COMPOSITIONS BASED ON HYDROXYSTYRENE COPOLYMERS

CROSS REFERENCE TO RELATED TO APPLICATION

This is a division of application Ser. No. 148,261, filed Jan. 25, 1988, now U.S. Pat. No. 4,869,994.

BACKGROUND OF THE INVENTION

The field of art to which this invention pertains is photoreactive compositions for use in photoresist coatings.

The physical properties of photoresist coatings change when the coatings are exposed to light. The change usually is one of solubility and results in solvent discrimination between exposed and unexposed areas. Exposure of coatings to light through a pattern results in solubility changes and, therefore, image boundaries that can be used to form resist images. Images can be produced by solvent development in either negative-or positive-working modes.

The negative-working mode depends on a light induced decrease in solubility of polymer molecules. The positive-working mode is just the opposite, i.e., exposure to light makes the polymer more soluble in the solvent (developer).

Photoresist polymer compositions must fulfill a number of physical property dependent requirements under practical working conditions. The polymers must form homogeneous solutions in ecologically acceptable solvents; form smooth, flaw-free coatings with good adhesion in all process steps; be characterized by good solution stability for storage; form tack-free coatings; provide good image discrimination; resist flow or creep during processing at high temperatures; form thermally stable images that do not flow; and be removable or strippable after the required fabrication steps.

Negative acting photoresists based on polydienes cross-linked with bisazides are described in The Journal of Photographical Science, Volume 12, p 181 (1964). Photoresist systems based on poly(cis-isoprene) and bis(4-azidobenzal)cyclohexanone have been studied using infrared and ultraviolet spectroscopy, solvent extraction and thin layer chromatography as described in The Journal of the Electrochemical Society, Volume 124, p 1394 (1977).

Photoresist compositions based on poly(vinylphenols) are described in U.S. Pat. No. 3,869,292 and U.S. Pat. No. 4,439,516. Such compositions are made from poly(vinylphenols) and sensitizers, such as aromatic esters or amides of ortho-naphthoquinone diazide sulfonic or carboxylic acid.

Positive acting photoresists are described in U.S. Pat. No. 4,409,317. Such compositions contain alkali soluble resins such as poly(vinylphenol).

Photosensitive compositions made from polymers of the reaction product of p-vinylphenol and cinnamic acid chloride are described in U.S. Pat. No. 3,882,084.

Positive or negative acting photoresist compositions are described in U.S. Pat. No. 4,491,628. Such compositions are made from polymers which contain acid labile groups, such as tertiary butyl carbonates of poly(vinylphenols).

In U.S. Pat. No. 4,469,778, photosensitive compositions in which the photosensitizers are bisazide compounds are described.

SUMMARY OF THE INVENTION

This invention pertains to negative-acting photoresist compositions based on 4-hydroxystyrene copolymers.

The negative-acting photoresist compositions of this invention are made from (A) copolymers of 4-hydroxystyrene and other monomers selected from the group consisting of dialkyl muconates, alkyl sorbates, alkadiene monomers and allyl esters of ethylenically unsaturated acids wherein the copolymers contain about 10 to about 90 weight percent 4-hydroxystyrene and about 90 to about 10 weight percent other monomer and (B) an azide photosensitizer.

By varying the particular azide photosensitizer in the composition, negative-acting photoresist compositions can be made that are photosensitive to radiation in the deep ultraviolet up to visible light.

DESCRIPTION OF THE INVENTION

The 4-hydroxystyrene copolymers useful in this invention are prepared by copolymerizing 4-acetoxystyrene with the other monomers, followed by selective hydrolysis of the acetoxy groups to phenol groups using the procedures set forth in copending applications, Ser. No. 099,429, filed Sept. 11, 1987, and Ser. No. 099,430, filed Sept. 11, 1987.

The 4-acetoxystyrene monomers can be made by the process described in Corson et. al., Journal of Oroanic Chemistry 23, 544–549 (1958). As described in this article, phenol is acetylated to 4-hydroxyacetophenone which is then acetylated to 4-acetoxyacetophenone. This compound is then hydrogenated to 4-acetoxyphenylmethylcarbinol, which is then dehydrated to 4-hydroxystyrene.

The dialkyl muconates which are used in preparing copolymers utilized in this invention are diester derivatives of muconic acid. Muconic acid is a diolefinically unsaturated adipic acid derivative and can be made by the microbiological oxidation of various hydrocarbon substrates, as described in U.S. Pat. No. 4,480,034 and U.S. Pat. No. 4,534,059. The dialkyl muconates used in this invention contain 1 to 4 carbon atoms in each alkyl group and are made by the direct esterification of muconic acid with methanol, ethanol, the propanols, or the butanols. The preferred dialkyl muconates useful in this invention are dimethyl muconate and diethyl muconate.

The alkyl sorbates which are used in preparing copolymers reacted in this invention are ester derivatives of sorbic acid. Sorbic acid, or hexadienoic acid, is a diolefinically unsaturated acid which can be made by the ring opening of the beta-lactone made from crotonaldehyde and ketene. The alkyl sorbates used in this invention contain 1 to 4 carbon atoms in each alkyl group and can be made by the direct esterification of sorbic acid with methanol, ethanol, the propanols, or the butanols. The preferred alkyl sorbates useful in this invention are methyl sorbate and ethyl sorbate.

The alkadiene monomers useful in this invention are hydrocarbon monomers which contain two conjugated ethylenically unsaturated groups and which polymerize through 1,2 or 1,4 addition leaving one unsaturated group unpolymerized. Examples of such monomers are 1,3-butadiene, 1,3-pentadiene, 1,3-hexadiene, 2,4-hexadiene, isoprene and chloroprene.

The allyl ester monomers useful in this invention are mono and diallyl esters of, respectively, mono and dicarboxylic acids which contain one polymerizable ethylenically unsaturated group. Examples of such esters include allyl acrylate, allyl methacrylate, allyl ethacrylate, diallyl maleate, alkyl allyl maleate, diallyl fumarate, alkyl allyl fumarate, diallyl itaconate, alkyl allyl itaconate, allyl sorbate, diallyl muconate and alkyl allyl muconate.

In preparing copolymers with the alkadiene monomers, the sorbate monomers and the muconate monomers, polymerization takes place either 1,2 or 1,4 leaving an unsaturated group which is polymerizable by radiation. The allyl ester monomers polymerize through the ethylenic unsaturation in the acid portion of the monomer leaving the allyl unsaturation intact. Polymers formed from the diene monomers and from the allyl monomers can be crosslinked by radiation.

The copolymers are prepared by the free radical polymerization of 4-hydroxystyrene and the other monomers in solution, emulsion, or suspension using well known polymerization techniques. The copolymers contain about 10 to about 90 weight percent 4-hydroxystyrene to about 90 to about 10 weight percent other monomers. Preferred copolymers contain about 40 to about 80 weight percent 4-hydroxystyrene to about 60 to about 20 weight percent other monomers.

The 4-acetoxystyrene copolymers are converted to 4-hydroxystyrene copolymers by acid or base hydrolysis using the procedures described in copending applications, Ser. No. 099,429, filed Sept. 11, 1987, and Ser. No. 099,430, filed Sept. 11, 1987, which applications are hereby incorporated by reference.

The photosensitizers useful in this invention are aromatic azides and bisazides. These photosensitizers are selected based on their compatibility with the hydroxystyrene copolymers, their solubility in the solvents used in the formulations, and their sensitivity to ultraviolet (UV) radiation, i.e., the wavelength range of UV light which can be varied from near UV to mid UV to deep UV radiation. Near UV refers to ultraviolet light having a wavelength ranging from about 310 to about 465 nanometers, mid UV refers to ultraviolet light having a wavelength range of from about 280 to about 310 nanometers and deep UV refers to ultraviolet light having a wavelength ranging from about 230 to about 280 nanometers. Such photosensitizers are described in U.S. Pat. Nos. 3,669,669, 3,917,794, 4,329,419 and U.S. Pat. No. 4,469,778, which patents are hereby incorporated by reference. Publications which are incorporated by reference are "Photoresist Materials and Processes," W. S. DeForest, McGraw-Hill Book Company, 1975, Chapter 2, Pages 38-40 and T. Iwayanagi, et al., J. Electrochem. Soc., Vol. 127, Page 2759 (1980).

Examples of photosensitizers useful in this invention are 2,6-bis(4-azidyl-benzylidene)-cyclohexanone, 2,6-bis(4-azidyl-benzylidene)-4-methylcyclohexanone, 4,4'-diazidodiphenyl ether, 4,4'-diazidophenyl sulfide, 4,4'-diazidodiphenyl sulfone, 3,3'-diazidodiphenyl sufone, 4,4'-diazidodiphenylmethane, 3,3'-dichloro-4,4'-diazidodiphenylmethane, 4,4'-diazidodiphenyl disulfide, 4,4'-diazidobibenzyl and 4,4'-diazido-stilbene-2,2'-disodium sulfonate.

The azide photosensitizers are used with the 4-hydroxystyrene copolymers in the amount of about 1 to about 5 weight percent based on the weight of photosensitizer and copolymer. The preferred range is about 2 to about 3 weight percent.

In utilizing the compositions of this invention as photoresist materials, the 4-hydroxystyrene copolymers and the photosensitizer are dissolved in a solvent, are spin coated on a suitable substrate and are heated to remove the solvent. The coating is then exposed to radiation in an image-wise configuration, e.g., exposed to U.V. radiation through a photomask, and is again heated. The portions of the coating on which the radiation falls are crosslinked. When the coating is placed in a suitable solvent, the unexposed portions of the coating are dissolved, leaving a negative image on the substrate.

Any solvents which are not photoreactive and which dissolve the 4-hydroxystyrene copolymers and the photosensitizers can be used in this invention. Examples of such solvents are esters, e.g., ethyl acetate, butyl acetate and amyl acetate, ketones, e.g., acetone, methylethyl ketone, methylisobutyl ketone, alcohols, e.g., 2-ethoxyethanol, 2-methoxyethanol, 2-methoxypropanol-1 and the like. Aqueous solvents such as aqueous solutions of quaternary ammonium hydroxide, e.g., tetralkyl ammonium hydroxide, can also be used provided the bisazides that are soluble in these solvents are used as photosensitizers. Mixtures of such solvents can also be used.

Generally the copolymers and photosensitizers used in this invention are dissolved in the solvents at a concentration of about 5 weight percent up to about 50 weight percent, preferably, up to about 25 weight percent. The so formed solutions are then filtered through filters having pore sizes of 1 micrometer or less. The solutions are then spun coated on glass, quartz or silicon wafers to a coating thickness of about 0.5 to about 3 micrometers. The coatings are then heated at a temperature of about 50° to about 100° C. for a time sufficient to remove the solvent, generally about 10 minutes to about 1 hour. A photomask is then fitted over the wafer and the wafer is exposed to U.V. radiation. The coated wafers can then be heated again before developing them in a suitable solvent. Preferred solvents are the solvents which are used to form solutions of the copolymers and photosensitizers as described hereinbefore. Other solvents which will dissolve the unexposed coating but not the exposed and crosslinked coating can also be used. The resulting negative images can be used as fine line photoresists in the manufacture of semiconductor chips, printed circuit boards, microelectronics, and other electronic photographic applications, e.g., photolithography and graphic arts, printing plates and dies.

The following examples describe the invention in more detail. Parts and percentages, unless otherwise designated, are parts and percentages by weight.

EXAMPLE 1

One part of a copolymer of 4-hydroxystyrene and dimethylmuconate in a molar weight ratio of 5:3, 0.03 part of 2,6-bis(4-azidyl-benzylidene)-4-methylcyclohexanone, are dissolved in 10 parts by volume of butyl acetate. The solution is filtered through a Millipore 1 micrometer filter and is spun coated on 2 inch by 2 inch glass plates at 1500 rpm for 60 seconds. The coated plates are heated at 80° C. for 30 minutes in a forced air oven. The coatings are then contacted with a chrome photomask, are exposed to ultraviolet radiation—37 mw/cm$^2$ —for 2 seconds and are then dipped in butyl acetate to dissolve the unexposed coating. Fine line negative images are formed.

EXAMPLE 2

Using the same procedure described in Example 1, coatings are made on glass plates: using 4-hydroxystyrene (HSM) copolymerized with dimethyl muccinate (MMu), diethyl muconate (EMu) or methyl sorbate (MSb) in admixture with 2,6-bis(4-azidyl-benzylidene)-

4-methylcyclohexanone (bisazide). After photomasking, and radiating with ultraviolet, negative images comparable to those described in Example 1 are obtained. The copolymers and amounts of components are listed in the Table.

TABLE

| Example | Copolymer | | | Bisazide |
| | Monomers | Molar Ratio | Parts by Weight | Parts by Weight |
| --- | --- | --- | --- | --- |
| 2A | HSM:EMu | 5:1 | 1 | 0.03 |
| 2B | HSM:MMu | 5:1 | 1 | 0.03 |
| 2C | HSM:EMu | 10:1 | 1 | 0.03 |
| 2D | HSM:MSb | 5:1 | 1 | 0.03 |

EXAMPLE 3

Using the same procedure described in Example 1, coatings on glass plates are made using a copolymer of 4-hydroxystyrene and diallyl maleate in a weight ratio of 8 to 2 and 3 weight percent 2,6-bis-(4-azidyl-benzylidene)-cyclohexanone dissolved in 2-methoxy-propanol-1. After photomasking and radiating with UV, negative images comparable to those described in Example 1 are obtained.

EXAMPLE 4

Using the same procedure described in Example 1, coatings on glass plates are made from a solution in 2-methoxy-propanol-1 of a copolymer of 4-hydroxystyrene and 2,5-dimethyl-2,4-hexadiene in a weight ratio of 7 to 3 and 3 weight percent 2,6-bis-(4-azidyl-benzylidene)-cyclohexanone. After photomasking and radiating with UV, negative images comparable to those described in Example 1 are obtained.

The principles, preferred embodiments and modes of operation of the present invention have been described in the foregoing specification. The invention which is intended to be protected herein, however, is not to be construed as limited to the particular forms disclosed, since these are to be regarded as illustrating rather than restrictive. Variations and changes may be made by those skilled in the art without departing from the spirit of the invention.

What is claimed:

1. A process for forming an image on a surface comprising depositing a negative acting photoresist composition on said surface as a film, wherein said composition consists essentially of a solution of (A) a copolymer of 4-hydroxystyrene and a monomer selected from the group consisting of dialkyl muconate, alkyl sorbate, alkadiene monomers and allyl esters of ethylenically unsaturated acids wherein the alkyl groups contain 1 to 4 carbon atoms and (B) an aromatic bisazide compound, heating the film to remove solvent, exposing a portion of the film to ultraviolet radiation which decreases the solubility of the copolymer, and removing the unexposed portion of said film with solvent.

2. The process of claim 1 wherein the ultraviolet radiation is near, mid and deep ultraviolet light.

3. The process of claim 1 wherein the copolymer contains about 10 to about 90 weight percent 4-hydroxystyrene and about 90 to about 10 weight percent other monomer.

4. The process of claim 1 wherein the copolymer contains about 40 to about 80 weight percent 4-hydroxystyrene and about 20 to about 60 weight percent other monomer.

5. The process of claim 1 wherein the dialkyl muconate is dimethyl muconate.

6. The process of claim 1 wherein the dialkyl muconate is diethyl muconate.

7. The process of claim 1 wherein the alkyl sorbate is methyl sorbate.

8. The process of claim 1 wherein the alkyl sorbate is ethyl sorbate.

9. The process of claim 1 wherein the alkadiene monomer is 2,5-dimethyl-2,4- hexadiene.

10. The process of claim 1 herein the allyl ester is diallyl maleate.

11. The process of claim 1 wherein the diazide photosensitizer is 2,6-bis(4-azidyl-benzylidene-4-methylcyclohexanone).

12. The process of claim 11 wherein the bisazide is present in the amount of about 1 to about 5 weight percent based on the weight of copolymer and bisazide.

13. The process of claim 12 wherein the bisazide is present in the amount of about 2 to about 3 weight percent.

* * * * *